United States Patent
Ito

(10) Patent No.: US 7,535,284 B2
(45) Date of Patent: May 19, 2009

(54) SWITCHING CONTROL CIRCUIT

(75) Inventor: Tatsuo Ito, Ota (JP)

(73) Assignees: Sanyo Electric Co., Ltd., Osaka (JP);
Sanyo Semiconductor Manufacturing Co., Ltd., Niigata (JP)

(*) Notice: Subject to any disclaimer, the term of this patent is extended or adjusted under 35 U.S.C. 154(b) by 0 days.

(21) Appl. No.: 11/959,369

(22) Filed: Dec. 18, 2007

(65) Prior Publication Data
US 2008/0157849 A1  Jul. 3, 2008

(30) Foreign Application Priority Data
Dec. 27, 2006  (JP)  ............................. 2006-353097

(51) Int. Cl.
*G05F 1/10* (2006.01)
(52) U.S. Cl. ........................ 327/538; 327/540
(58) Field of Classification Search ................. 327/376, 327/377, 538, 540, 541, 543
See application file for complete search history.

(56) References Cited

U.S. PATENT DOCUMENTS

| | | | | |
|---|---|---|---|---|
| 5,373,226 A | * | 12/1994 | Kimura | 323/313 |
| 5,856,756 A | * | 1/1999 | Sasahara et al. | 327/540 |
| 6,798,276 B2 | * | 9/2004 | Mori et al. | 327/541 |
| 7,095,272 B2 | * | 8/2006 | Morishita | 327/541 |
| 7,221,213 B2 | * | 5/2007 | Lee et al. | 327/541 |
| 7,365,595 B2 | * | 4/2008 | Lee | 327/538 |

FOREIGN PATENT DOCUMENTS

JP   2002-171749   6/2002

* cited by examiner

*Primary Examiner*—Lincoln Donovan
*Assistant Examiner*—Hai L. Nguyen
(74) *Attorney, Agent, or Firm*—SoCal IP Law Group LLP; Steven C. Sereboff; John E. Gunther

(57) ABSTRACT

A switching control circuit, controlling a transistor, of a voltage generating circuit generating an output voltage of a target level from an input voltage applied to the transistor, comprising: an error amplifier circuit outputting an error voltage obtained by amplifying an error between a voltage according to the output voltage and a first reference voltage; a first comparison circuit comparing the error voltage with a second reference voltage to output a first control voltage; a second comparison circuit comparing the error voltage with a third reference voltage to output first and second voltages a charging and discharging circuit for charging and discharging a capacitor based on the first and second voltages; a third comparison circuit comparing a charged voltage of the capacitor with a fourth reference voltage; and a control circuit outputting a second control voltage for turning off the transistor according to a result of the third comparison circuit.

5 Claims, 9 Drawing Sheets

SWITCHING CONTROL CIRCUIT

CROSS-REFERENCE TO RELATED APPLICATION

This application claims the benefit of priority to Japanese Patent Application No. 2006-353097, filed Dec. 27, 2006, of which full contents are incorporated herein by reference.

BACKGROUND OF THE INVENTION

1. Field of the Invention

The present invention relates to a switching control circuit.

2. Description of the Related Art

In various electronic devices, there is used a voltage generating circuit generating an output voltage of a target level from an input voltage. Hereinafter, with reference to FIGS. 7 and 8, there will be given a description of a step-down voltage generating circuit 100, for example. The voltage generating circuit 100 is configured to include: a p-type MOSFET (Metal Oxide Semiconductor Field Effect Transistor) 101; a diode 102; an inductor 103; and a capacitor 104. A source electrode of the p-type MOSFET 101 is applied with an input voltage Vin. When the p-type MOSFET 101 is turned on, substantially the same voltage as the input voltage Vin is applied to the inductor 103. As a result, the capacitor 104 is charged, and thereby, an output voltage Vout is increased. Alternatively, when the p-type MOSFET 101 is turned off, a current passes through a loop configured with the diode 102, the inductor 103, and the capacitor 104 by energy accumulated in the inductor 103. As a result, the capacitor 104 is discharged, and thereby, the output voltage Vout is decreased. In this manner, the voltage generating circuit 100 is controlled so as to turn on and off the p-type MOSFET 101 with an appropriate timing so that the output voltage Vout can reach a target level.

In order to control switching of the p-type MOSFET 101, the voltage generating circuit 100 is configured to include a switching control circuit 105, and resistances 106 and 107, in addition to the above-described configuration. The switching control circuit 105 is configured to further include: an error amplifier circuit 111; a power supply 112; a comparison circuit 113; a triangular wave generator 114; a switching circuit 124; a p-type MOSFET 115; and an n-type MOSFET 116.

An input terminal of one polarity (+) (hereinafter, referred to as a + input terminal) of the error amplifier circuit 111 is applied with a reference voltage Vref1 according to the target level from the power supply 112, and an input terminal of the other polarity (−) (hereinafter, referred to as a − input terminal) thereof is applied with a feedback voltage Va obtained by dividing the output voltage Vout by a resistance ratio between the resistances 106 and 107. The error amplifier circuit 111 outputs an error voltage Vb (Vb in FIG. 8) obtained by amplifying an error between the reference voltage Vref1 and the feedback voltage Va. A + input terminal of the comparison circuit 113 is applied with the error voltage Vb and a − input terminal thereof is applied with a triangular-wave voltage Vt (Vt in FIG. 8) generated by the triangular wave generator 114, which changes at a predetermined frequency. The comparison circuit 113 outputs a voltage Vc of the H level during the period of time that the error voltage Vb is higher than the voltage Vt and outputs the voltage Vc of the L level during the period of time that the error voltage Vb is lower than the voltage Vt (Vc in FIG. 8). The H level indicates a voltage sufficient to turn on the n-type MOSFET 116 and sufficient to turn off the p-type MOSFET 115. The L level indicates a voltage sufficient to turn on the p-type MOSFET 115 and sufficient to turn off the n-type MOSFET 116. The switching circuit 124 is switched to a side of the comparison circuit 113 during the period of time that a comparison circuit 121 described later outputs the voltage Ve of the H level. Thus, based on the voltage Vc of the H level, the p-type MOSFET 115 is turned off, the n-type MOSFET 116 is turned on, and the p-type MOSFET 101 is turned on. As a result, the output voltage Vout is increased. On the other hand, based on the voltage Vc of the L level, the p-type MOSFET 115 is turned on, the n-type MOSFET 116 is turned off, and the p-type MOSFET 101 is turned off. As a result, the output voltage Vout is decreased. That is, as the error between the feedback voltage Va and the reference voltage Vref1 becomes greater, the error voltage Vb is increased, and the period during which the comparison circuit 113 outputs the voltage Vc of the H level becomes longer. As a result, the output voltage Vout is increased. As the error between the feedback voltage Va and the reference voltage Vref1 becomes smaller, the error voltage Vb is decreased and the period during which the comparison circuit 113 outputs the voltage Vc of the L level becomes longer. As a result, the output voltage Vout is decreased. In this manner, in the switching control circuit 105, the output voltage Vc of the comparison circuit 113 is so-called PWM (Phase Width Modulation)-controlled such that the feedback voltage Va matches the reference voltage Vref1.

There may be cases where the power supply line 109 is short-circuited due to adhesion, etc. of dust or solder to a power supply line 109 to which the output voltage Vout is applied, and as a result, the output voltage Vout is grounded, for example. In this case, the error between the reference voltage Vref1 and the feedback voltage Va becomes great, so that an on state of the p-type MOSFET 101 is continued. As a result, a current is continuously supplied to the p-type MOSFET 101, the inductor 103, and the capacitor 104. Consequently, the p-type MOSFET 101, etc., may be damaged. Therefore, the voltage generating circuit 100 is provided with a capacitor 108 in order to turn off the p-type MOSFET 101 when the power supply line 109 is short-circuited. The switching control circuit 105 is further provided with a comparison circuit 117, a power supply 118, an n-type MOSFET 119, a current source 120; the comparison circuit 121, a power supply 122, and a latch circuit 123.

A + input terminal of the comparison circuit 117 is applied with a reference voltage Vref2 (Vref2 in FIG. 8) and a − input terminal thereof is applied with the error voltage Vb. The reference voltage Vref2 is: lower than the error voltage Vb (between t105 and t106 in FIG. 8) in the case where the power supply line 109 is short-circuited; and higher than the error voltage Vb (linear error voltage Vb up to t101, for example) in the case where the output voltage Vout is at a target level. The error voltage Vb between t101 and t102 and between t103 and t104 shown in FIG. 8 indicates the error voltage Vb: in the case where a noise superimposition occurs on the power supply line 109, the resistances 106 and 107, etc., or on a connection line from a connection point between the resistances 106 and 107 to the − input terminal of the error amplifier circuit 111; or in the case where a short-circuited state of the power supply line 109 is released in a period shorter than a period T (between t105 and t106 in FIG. 8) elapsing before a charged voltage of the capacitor 108 reaches a reference voltage Vref3 (hereinafter, referred to as generation of noise, etc.). The comparison circuit 117 outputs the H level during the period of time that the error voltage Vb is lower than the reference voltage Vref2, and outputs the L level during the period of time that the error voltage Vb is higher than the reference voltage Vref2. The H level indicates a voltage sufficient to turn on the n-type MOSFET 119, and the L level indicates a voltage sufficient to turn off the n-type MOSFET 119. That is, the comparison circuit 117 outputs the L level during the period of time that the error voltage Vb is higher than the reference voltage Vref2 as a result of the short-circuit of the power supply line 109, the generation of noise, etc. When the n-type MOSFET 119 is turned off based on the L level, a current from the current source 120 is supplied to the capacitor 108, and thereby the capacitor 108 is charged. A + input terminal of the comparison circuit 121 is applied with the reference voltage Vref3 (Vref3 in FIG. 8) and a − input terminal thereof is applied with a voltage Vd (voltage Vd in FIG. 8) of the connection line 110. The connection line 110 is applied to the charged voltage of the capacitor 108. The reference voltage Vref3 is lower by a predetermined level than a charged voltage at the time that the capacitor 108 is fully charged, for example. The comparison circuit 121 outputs a voltage Ve of the H level during the period of time that the voltage Vd applied to the − input terminal is lower than the reference voltage Vref3, and outputs a voltage Ve of the L level during the period of time that the voltage Vd applied to the − input terminal is higher than the reference voltage Vref3 (Ve in FIG. 8). As the period of time between t101 and t102 or between t103 and t104 shown in FIG. 8, when the period of time during which the error voltage Vb is higher than the reference voltage Vref2 as a result of the generation of noise, etc. is shorter than the period T indicating the period until the charged voltage of the capacitor 108 reaches the reference voltage Vref3, the output of the comparison circuit 121 remains the voltage Ve of the H level. When the latch circuit 123 outputs the H level based on the voltage Ve of the H level, a switch state of the switching circuit 124 is held to the side of the comparison circuit 113. That is, even when the error voltage Vb is higher than the reference voltage Vref2 as a result of the generation of noise, etc., the p-type MOSFET 101 is controlled as to on and off based on the output voltage Vc of the comparison circuit 113. On the other hand, As the period of time between t105 and t106, when the period of time during which the error voltage Vb is higher than the reference voltage Vref2 as a result of the short-circuit of the power supply line 109 reaches the period T indicating the period until the charged voltage of the capacitor 108 reaches the reference voltage Vref3, the output of the comparison circuit 121 becomes the voltage Ve of the L level. When the latch circuit 123 latches the L level and outputs it based on the voltage Ve of the L level, the switching circuit 124 is switched to a side of the latch circuit 123. Thus, based on the L level via the switching circuit 124, the p-type MOSFET 115 is turned on and the n-type MOSFET 116 is turned off, so that the p-type MOSFET 101 is held in the off state. As a result, the supply of the current via the p-type MOSFET 101 to the inductor 103 and the capacitor 104 is interrupted, and thereby preventing the damage of the p-type MOSFET 101, etc. That is, if the state that the error voltage Vb is higher than the reference voltage Vref2 lasts for the period T elapsing before the charged voltage of the capacitor 108 reaches the reference voltage Vref3, the latch circuit 123 latches the L level, thereby holding the p-type MOSFET 101 in an off state (See Japanese Patent Laid-Open No. 2002-171749).

However, when there is generated noise making the voltage Vd as shown in t107 in FIG. 9 higher than the reference voltage Vref3 in the connection line 110 or the capacitor 108, the comparison circuit 121 outputs the voltage Ve of the L level, so that the p-type MOSFET 101 is held in the off state. That is, with respect to a temporary generation of noise, etc., in the power supply line 109, etc., the voltage generating circuit 100 prevents the p-type MOSFET 101 from being held in the off state by being provided with the capacitor 108, the comparison circuit 121, etc. However, with respect to a temporary generation of noise in the capacitor 108 or the connection line 110, measures to prevent the p-type MOSFET 101 from being held in the off state are not taken. As a result, when the voltage Vd higher than the reference voltage Vref3 is applied to the − input terminal of the comparison circuit 121, the p-type MOSFET 101 may be held in the off state even though the power supply line 109 is not short-circuited, and the output voltage Vout of a target level may not be able to be generated from the input voltage Vin.

SUMMARY OF THE INVENTION

A switching control circuit of a voltage generating circuit according to an aspect of the present invention, which generates an output voltage of a target level from an input voltage by turning on and off a transistor applied with the input voltage, the switching control circuit controlling the transistor as to on and off, comprises: an error amplifier circuit configured to output an error voltage obtained by amplifying an error between a voltage according to the output voltage and a first reference voltage according to the target level; a first comparison circuit configured to compare between the error voltage and a second reference voltage changing at a predetermined frequency to output a first control voltage for turning on and off the transistor; a second comparison circuit configured to compare between the error voltage and a third reference voltage to: output a first voltage when the error voltage is higher than the third reference voltage; and output a second voltage when the error voltage is lower than the third reference voltage; a charging and discharging circuit configured to charge a capacitor based on the first voltage and to discharge the capacitor based on the second voltage; a third comparison circuit configured to compare between a charged voltage of the capacitor and a fourth reference voltage according to a capacitance of the capacitor; and a control circuit configured to output a second control voltage for turning off the transistor irrespective of the first control voltage, when a comparison result of the third comparison circuit in the case where the charged voltage of the capacitor is higher than the fourth reference voltage continues for a predetermined period.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Configuration of Voltage Generating Circuit 1

Figure 1:
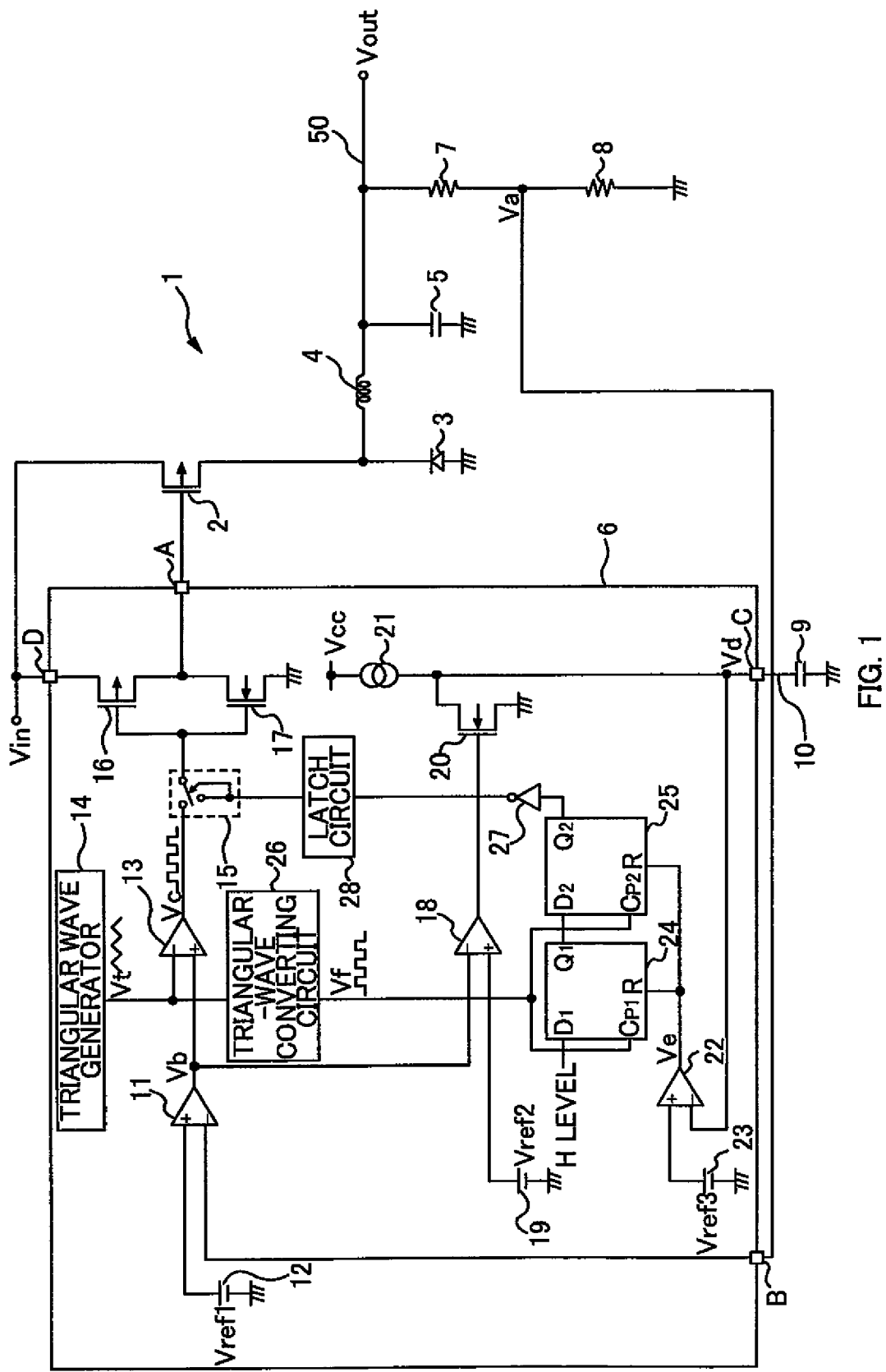
FIG. 1 is a diagram showing a configuration of a voltage generating circuit including a switching control circuit according to one embodiment of the present invention.
Figure 2:
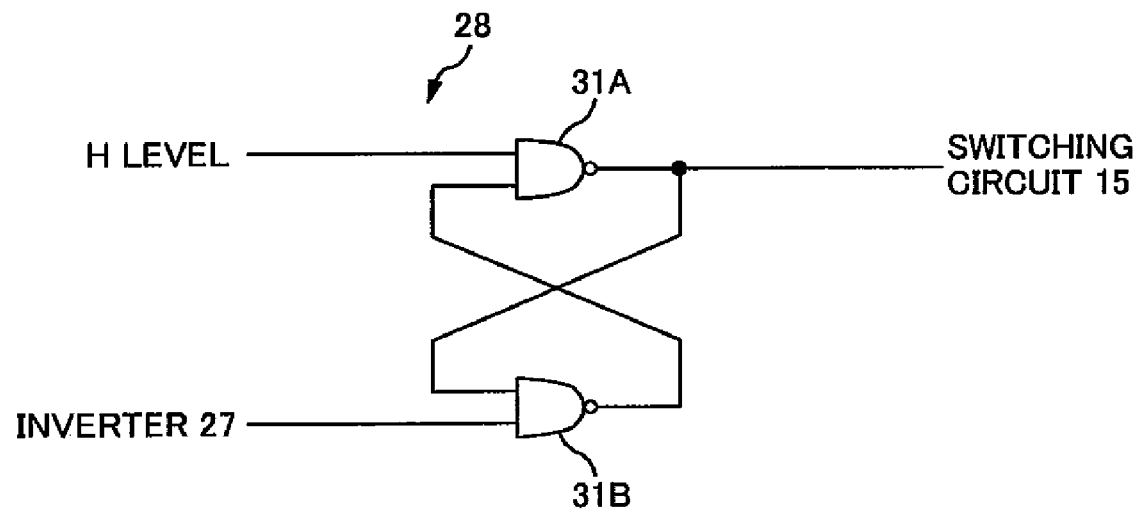
FIG. 2 is a diagram showing one example of a configuration of a latch circuit.

Hereinafter, with reference to FIG. 1 and FIG. 2, there will be given a description of a configuration of a voltage generating circuit 1 using a switching control circuit 6 according to the present invention. FIG. 1 is a diagram showing one example of a configuration of the voltage generating circuit 1 including the switching control circuit 6 according to the present invention. FIG. 2 is a diagram showing one example of a configuration of a latch circuit 28 shown in FIG. 1. The description will be made assuming that the switching control circuit 6 is an integrated circuit (IC).

Configuration of Voltage Generating Circuit 1

The voltage generating circuit 1 includes: a p-type MOSFET 2 (transistor); a diode 3; an inductor 4; a capacitor 5; the switching control circuit 6; resistances 7 and 8; and a capacitor 9.

A gate electrode of the p-type MOSFET 2 is connected to an A terminal of the switching control circuit 6, a source electrode thereof is applied with an input voltage Vin, and a drain electrode thereof is connected to one end of the inductor 4 and a cathode of the diode 3. When the gate electrode of the p-type MOSFET 2 is applied via the A terminal with the L level, the p-type MOSFET 2 is turned on, and when applied with the H level, the p-type MOSFET 2 is turned off.

An anode of the diode 3 is grounded. The other end of the inductor 4 is connected to one end of the capacitor 5 and one end of the resistance 7. The other end of the capacitor 5 is grounded. A voltage of a power supply line 50 on which a connection point between the other end of the inductor 4 and one end of the capacitor 5 lies, i.e., a charged voltage of the capacitor 5, is an output voltage Vout.

The resistances 7 and 8 are connected in series between the power supply line 50 and a ground. A connection point between the resistance 7 and the resistance 8 is connected to a B terminal of the switching control circuit 6. As a result, the B terminal of the switching control circuit 6 is applied with a feedback voltage Va obtained by dividing the output voltage Vout by a resistance ratio between the resistances 7 and 8.

One end of the capacitor 9 is connected to a C terminal of the switching control circuit 6 and the other end thereof is grounded. The capacitor 9 includes a capacitance upon which a reference voltage Vref3 is based, which is generated by a power supply 23 described later.

Configuration of Switching Control Circuit 6

The switching control circuit 6 is includes: an error amplifier circuit 11; a power supply 12; a comparison circuit 13 (first comparison circuit); a triangular wave generator 14; a switching circuit 15; a p-type MOSFET 16; an n-type MOSFET 17; a comparison circuit 18 (second comparison circuit); a power supply 19; an n-type MOSFET 20; a current source 21; a comparison circuit 22 (third comparison circuit); the power supply 23; D-FF (Delay Flip Flop) circuits 24 and 25; a triangular-wave converting circuit 26 (generating circuit); an inverter 27; a latch circuit 28 (hold circuit); and A to D terminals. The triangular wave generator 14, the D-FF circuits 24 and 25, and the inverter 27 make up a control circuit. The n-type MOSFET 20 and the current source 21 make up a charging and discharging circuit. The D-FF circuits 24 and 25, and the inverter 27 make up an output circuit.

A + input terminal of the error amplifier circuit 11 is applied with a reference voltage Vref1 (first reference voltage) according to a target level from the power supply 12, a − input terminal thereof is connected to the B terminal, and an output terminal thereof is connected to a + input terminal of the comparison circuit 13 and a − input terminal of the comparison circuit 18. The reference voltage Vref1 is set to a voltage which is ½ of the output voltage Vout of the target level when a resistance ratio between the resistances 7 and 8 is 1:1, for example. The error amplifier circuit 11 outputs an error voltage Vb obtained by amplifying an error between the reference voltage Vref1 and the feedback voltage Va via the B terminal.

The triangular wave generator 14 generates a triangular-wave voltage Vt (second reference voltage) which changes at a predetermined frequency, to be output to the − input terminal of the comparison circuit 13 and the triangular-wave converting circuit 26.

An output terminal of the comparison circuit 13 is connected to the switching circuit 15. The comparison circuit 13 outputs a voltage Vc (first control voltage) of the H level during the period of time that the error voltage Vb is higher than the voltage Vt, and outputs a voltage Vc (first control voltage) of the L level during the period of time that the error voltage Vb is lower than the voltage Vt. The H level indicates a voltage sufficient to turn on the n-type MOSFET 17 and a voltage sufficient to turn off the p-type MOSFET 16. The L level indicates a voltage sufficient to turn on the p-type MOSFET 16 and a voltage sufficient to turn off the n-type MOSFET 17.

The switching circuit 15 is switched to a side of the comparison circuit 13 during the period of time that the switching circuit is inputted with the H level from the latch circuit 28. Thereby, the output terminal of the comparison circuit 13 is connected to each gate electrode of the p-type MOSFET 16 and the n-type MOSFET 17 so that each gate electrode of the p-type MOSFET 16 and the n-type MOSFET 17 is applied with the voltage Vc. Further, the switching circuit 15 is switched to a side of the latch circuit 28 during the period of time that the switching circuit is inputted with the L level from the latch circuit 28. Thereby, the latch circuit 28 is connected to each gate electrode of the p-type MOSFET 16 and the n-type MOSFET 17 so that each gate electrode of the p-type MOSFET 16 and the n-type MOSFET 17 is applied with the L level.

The D terminal is applied with the input voltage Vin. The p-type MOSFET 16 and the n-type MOSFET 17 make up a CMOS (Complementary Metal Oxide Semiconductor) inverter circuit. A source electrode of the p-type MOSFET 16 is connected to the D terminal and a drain electrode thereof is connected to a drain electrode of the n-type MOSFET 17 and the A terminal. When a gate electrode of the p-type MOSFET 16 is applied with the L level, the p-type MOSFET 16 is turned on and the drain electrode thereof becomes the H level. The H level of the drain electrode of the p-type MOSFET 16 indicates a voltage sufficient to turn off the p-type MOSFET 2. When the gate electrode of the p-type MOSFET 16 is applied with the H level, the p-type MOSFET 16 is turned off. A source electrode of the n-type MOSFET 17 is grounded. When a gate electrode of the n-type MOSFET 17 is applied to the H level, the n-type MOSFET 17 is turned on and a drain electrode thereof becomes the L level. The L level of the drain electrode of the n-type MOSFET 17 indicates a voltage sufficient to turn on the p-type MOSFET 2. When the gate electrode of the n-type MOSFET 17 is applied with the L level, the n-type MOSFET 17 is turned off.

A + input terminal of the comparison circuit 18 is applied with a reference voltage Vref2 (third reference voltage) from the power supply 19, and an output terminal thereof is connected to a gate electrode of the n-type MOSFET 20. The reference voltage Vref2 is: lower than the error voltage Vb (see between t7 and t11 in FIG. 3) in the case where the power supply line 50 is short-circuited; and higher than the voltage Vt at a maximum value. The comparison circuit 18: outputs the H level (second voltage for discharging a capacitor) during the period of time that the error voltage Vb is lower than the reference voltage Vref2; and outputs the L level (first voltage for charging a capacitor) during the period of time that the error voltage Vb is higher than the reference voltage Vref2. The H level indicates a voltage sufficient to turn on the n-type MOSFET 20 and the L level indicates a voltage sufficient to turn off the n-type MOSFET 20.

A drain electrode of the n-type MOSFET 20 is connected to the current source 21, − input terminal of the comparison circuit 22, and the C terminal. A source electrode of the n-type MOSFET 20 is grounded. When a gate electrode of the n-type MOSFET 20 is applied with the H level, the n-type MOSFET 20 is turned on, and as a result, a current flowing from the current source 21 flows from the drain electrode to the source electrode, thereby the capacitor 9 is discharged. Further, when the gate electrode of the n-type MOSFET 20 is applied with the L level, the n-type MOSFET 20 is turned off, and as a result, the current flowing from the current source 21 is supplied to the capacitor 9, thereby the capacitor 9 is charged.

A + input terminal of the comparison circuit 22 is applied with the reference voltage Vref3 (fourth reference voltage) from the power supply 23, and an output terminal thereof is connected to reset (R) terminals of the D-FF circuits 24 and 25. The reference voltage Vref3 is lower by a predetermined level than the charged voltage at the time that the capacitor 9 is fully charged, for example. The comparison circuit 22 outputs a voltage Ve of the H level during the period of time that a voltage Vd of the C terminal applied to the − input terminal is lower than the reference voltage Vref3. The comparison circuit 22 outputs a voltage Ve of the L level during the period of time that the voltage Vd of the C terminal is higher than the reference voltage Vref3. The C terminal is applied with the charged voltage of the capacitor 9.

The triangular-wave converting circuit 26 generates, based on the voltage Vt, a square-wave voltage Vf (binary signal. See Vf in FIG. 3) which changes at a predetermined frequency, to be output to clock (Cp1 and Cp2) terminals of the D-FF circuits 24 and 25. The description will be made assuming that the triangular-wave converting circuit 26 in a present embodiment generates a voltage Vf which falls at a maximum value of the triangular-wave voltage Vt and rises at a minimum value of the voltage Vt, for example.

An input (D1) terminal of the D-FF circuit 24 is applied with the H level, and an output (Q1) terminal thereof is connected to an input (D2) terminal of the D-FF circuit 25. The D-FF circuit 24 becomes in a reset state during the period of time that an R terminal is applied with the voltage Ve of the H level, and outputs the L level from the Q1 terminal irrespective of application of the H level to the D1 terminal and application of the voltage Vf to the Cp1 terminal. The reset state of the D-FF circuit 24 is released during the period of time that the R terminal is applied with the voltage Ve of the L level. The D-FF circuit 24 becomes in a latch state at the rise of the voltage Vf of the Cp1 terminal, for example. The D-FF circuit 24 latches the H level inputted to the D1 terminal at this time to be input from the Q1 terminal.

An output (Q2) terminal of the D-FF circuit 25 is connected to an input terminal of the inverter 27. The D-FF circuit 25 becomes in a reset state during the period of time that an R terminal is inputted with the voltage Ve of the H level, and outputs the L level from a Q2 terminal irrespective of application of the output voltage from the Q1 terminal to the D2 terminal and application of the voltage Vf to the Cp2 terminal. Further, the reset state of the D-FF circuit 25 is released during the period of time that R terminal is applied with the voltage Ve of the L level. The D-FF circuit 25 becomes in a latch state at the rise of the voltage Vf of the Cp2 terminal, for example. The D-FF circuit 25 latches the output voltage of the Q1 terminal applied to the D2 terminal at this time to be output from the Q2 terminal. That is, the H level from the Q2 terminal is outputted after a time has elapsed from the rise of the voltage Vf at which the D-FF circuit 24 latches the H level to the subsequent rise of the voltage Vf, in a state where each of the R terminals is applied with the voltage Ve of the L level.

An output terminal of the inverter 27 is connected to the latch circuit 28. The inverter 27 outputs the H level obtained by inverting the L level applied to an input terminal thereof. Further, the inverter 27 outputs the L level (second control voltage) obtained by inverting the H level applied to the input terminal.

The latch circuit 28 is configured with NAND circuits 31A and 31B, as shown in FIG. 2, for example. One input terminal of the NAND circuit 31A is applied with the H level at the same time that the switching control circuit 6 is started, for example, the other input terminal thereof is connected to an output terminal of the NAND circuit 31B, and an output terminal thereof is connected to one input terminal of the NAND circuit 31B and the switching circuit 15. The NAND circuit 31A outputs the L level when both the one and the other input terminals thereof are applied with the H level, and otherwise outputs the H level. The H level indicates a voltage capable of switching the switching circuit 15 to the side of the comparison circuit 13. The L level indicates a voltage: which is capable of switching the switching circuit 15 to the side of the latch circuit 28; and which is sufficient to turn on the p-type MOSFET 16 and to turn off the n-type MOSFET 17. The other input terminal of the NAND circuit 31B is connected to the output terminal of the inverter 27. The NAND circuit 31B outputs the L level when both the one and the other input terminal thereof are applied with the H level, and otherwise outputs the H level. That is, once the inverter 27 outputs the L level, the latch circuit 28 configured as above keeps on outputting the L level irrespective of the subsequent output voltage of the inverter 27.

Operation of Voltage Generating Circuit 1

Figure 3:
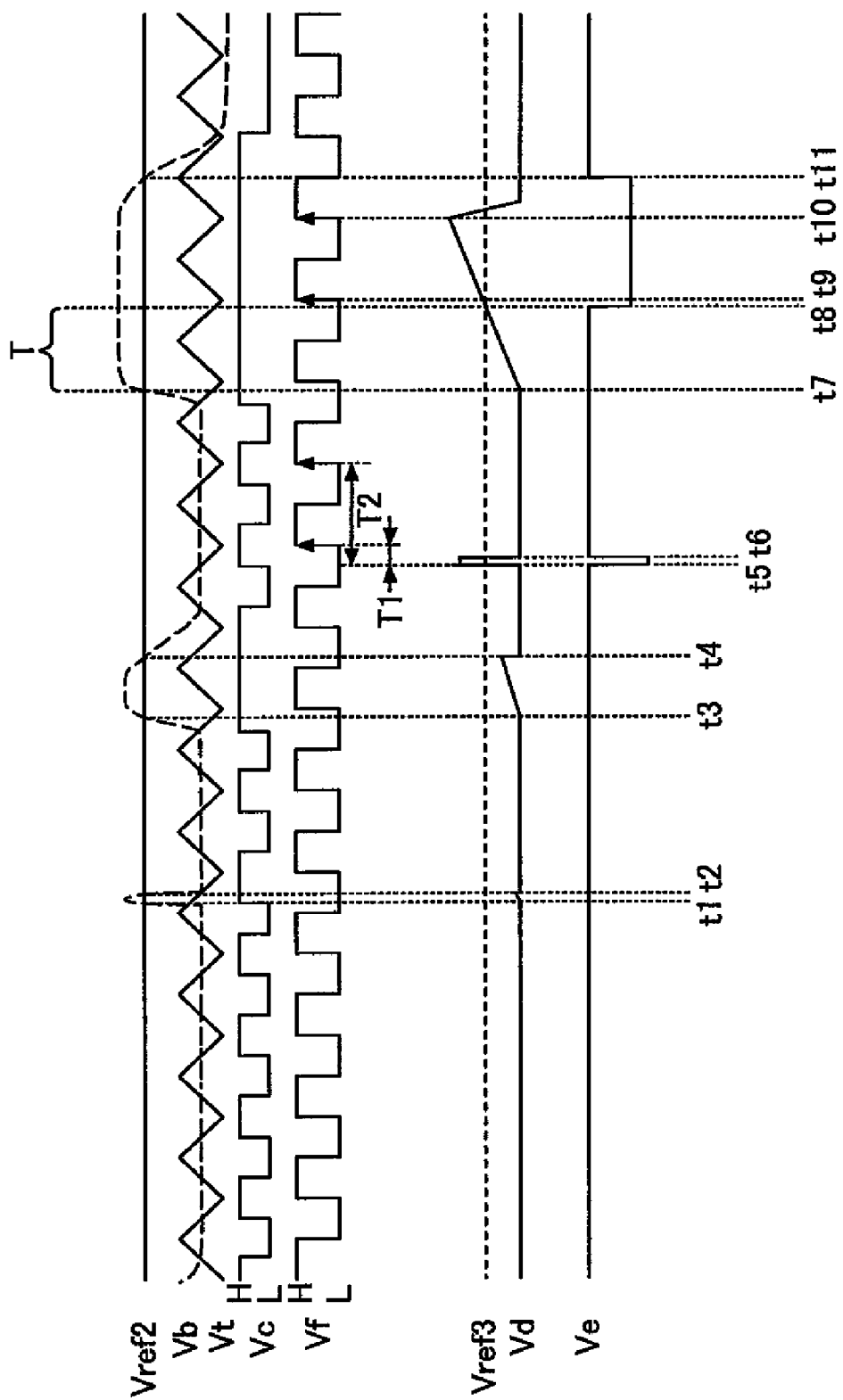
FIG. 3 is a timing chart showing an operation of the voltage generating circuit including a switching control circuit according to one embodiment of the present invention.

Hereinafter, with reference to FIG. 3 while appropriately using FIG. 1 and FIG. 2, there will be given a description of an operation of the voltage generating circuit 1 using the switching control circuit 6 according to the present invention. FIG. 3 is a timing chart showing one example of an operation of the switching control circuit 6 according to the present invention.

Operation for Outputting Output Voltage Vout of Target Level

Firstly, there will be given a description of an operation of the voltage generating circuit 1 using the switching control circuit 6 according to the present invention, for outputting the output voltage Vout of the target level.

When the switching control circuit 6 is started based on the input voltage Vin, for example, the comparison circuit 22 outputs the H level. The D-FF circuits 24 and 25 become in a reset state during the period of time that the R terminals are applied with the H level, and the D-FF circuit 25 outputs the L level from the Q2 terminal thereof. The inverter 27 outputs the H level obtained by inverting the L level. The other input terminal of the NAND circuit 31B is applied with the above H level. Further, the one input terminal of the NAND circuit 31A is applied with the H level at the same time that the switching control circuit 6 is started. Thus, the NAND circuit 31A outputs the H level, and the switching circuit 15 is switched to the side of the comparison circuit 13. Therefore, the output terminal of the comparison circuit 13 is connected to each gate electrode of the p-type MOSFET 16 and the n-type MOSFET 17.

A − input terminal of the error amplifier circuit 11 is applied with the feedback voltage Va of the connection point of the resistances 7 and 8 via the B terminal. The error amplifier circuit 11 outputs the error voltage Vb obtained by amplifying the error between the reference voltage Vref1 applied to the + input terminal and the feedback voltage Va applied to the − input terminal. The comparison circuit 13 outputs the H level during the period of time that the error voltage Vb applied to the + input terminal is higher than the voltage Vt applied to the − input terminal. Based on the H level, the p-type MOSFET 16 is turned off and the n-type MOSFET 17 is turned on. The gate electrode of the p-type MOSFET 2 is applied with the L level of the drain electrode of the n-type MOSFET 17 via the A terminal, and thereby, the p-type MOSFET 2 is turned on. As a result, the inductor 4 is applied with substantially the same voltage as the input voltage Vin, so that the capacitor 5 is charged, and thereby, the output voltage Vout is increased. On the other hand, the comparison circuit 13 outputs the L level during the period of time that the error voltage Vb applied to the + input terminal is lower than the voltage Vt applied to the − input terminal. Based on the above L level, the p-type MOSFET 16 is turned on and the n-type MOSFET 17 is turned off. The gate electrode of the p-type MOSFET 2 is applied with the H level of the drain electrode of the p-type MOSFET 16 via the A terminal, and thereby, the p-type MOSFET 2 is turned off. As a result, by energy accumulated in the inductor 4, a current is passed through a loop configured with the diode 3, the inductor 4, and the capacitor 5, so that the capacitor 5 is discharged, and thereby, the output voltage Vout is decreased. In this manner, the switching control circuit 6 controls the p-type MOSFET 2 as to on and off based on the error between the reference voltage Vref1 and the feedback voltage Va, so that the output voltage Vout of the target level is generated from the input voltage Vin.

Operation when Temporary Noise, etc. is Generated in Power Supply Line 50, etc.

Subsequently, there will be given a description of an operation when temporary noise, etc. is generated in the power supply line 50, etc. of the voltage generating circuit 1 using the switching circuit 6 according to the present invention. A description will be made assuming that a period during which the error voltage Vb is higher than the reference voltage Vref2 resulting from the generation of noise, etc. is shorter than a period T (between t7 and t8) elapsing before the charged voltage of the capacitor 9 reaches the reference voltage Vref3, as shown in between t1 and t2 and between t3 and t4 in FIG. 3.

The − input terminal of the error amplifier circuit 11 is applied, via the B terminal, with the feedback voltage Va according to the output voltage Vout in the case where noise, etc. is generated in the power supply line 50, etc. The above feedback voltage Va is lower (or higher) than the feedback voltage Va in the case where no noise, etc. is generated. The error amplifier circuit 11 outputs the error voltage Vb obtained by amplifying the error between the reference voltage Vref1 applied to the + input terminal and the feedback voltage Va applied to the − input terminal. The comparison circuit 18 outputs the L level during the period of time that the error voltage Vb is higher than the reference voltage Vref2. Based on the above L level, the n-type MOSFET 20 is turned off, and thus, a current from the current source 21 is supplied to the capacitor 9. As a result, the capacitor 9 is charged. The charged voltage of the capacitor 9 is applied to the C terminal of the switching control circuit 6, and the voltage Vd of the C terminal is applied to the − input terminal of the comparison circuit 22. The comparison circuit 22 outputs the H level during the period of time that the voltage Vd is lower than the reference voltage Vref3. The period during which the error voltage Vb becomes higher than the reference voltage Vref2 at this time is shorter than the period T elapsing before the charged voltage of the capacitor 9 reaches the reference voltage Vref3 as described above. Thus, the output of the comparison circuit 22 is not inverted but remains the voltage Ve of the H level. As a result, the reset state of the D-FF circuits 24 and 25 is held, and the switching state of the switching circuit 15 is held to the side of the comparison circuit 13. Therefore, even when temporary noise, etc. is generated in the power supply line 50, etc., there is continued the control of the p-type MOSFET 2 as to on and off based on the error between the reference voltage Vref1 and the feedback voltage Va, so that the output voltage Vout of the target level is generated from the input voltage Vin.

Operation when Noise is Generated in C terminal, etc.

Subsequently, there will be given a description of an operation of the case where noise is generated in the C terminal, the capacitor 9 or the connection line 10 (hereinafter, referred to as the C terminal, etc.) of the voltage generating circuit 1 using the switching control circuit 6 according to the present invention. The description will be made assuming that the voltage Vd of the C terminal becomes higher than the reference voltage Vref3 resulting from noise generated in the C terminal, etc., as shown in between t5 and t6 in FIG. 3.

The comparison circuit 22 outputs the voltage Ve of the L level during the period of time that the voltage Vd applied to the − input terminal is higher than the reference voltage Vref3. The reset state of the D-FF circuits 24 and 25 is released during the period of time that the voltage Ve of the L level is applied to each R terminal. The triangular-wave converting circuit 26 generates the square-wave voltage Vf, which falls at the maximum value of the voltage Vt and rises at the minimum value thereof, to be output to the Cp1 terminal and the Cp2 terminal of the D-FF circuits 24 and 25. Herein, in a present embodiment, a period (t5 to t6) of from the rise of the voltage Vd to the fall thereof resulting from noise generated in the C terminal, etc. is shorter than the period T1 of from the rise of the voltage Vd to the rise of the voltage Vf. Therefore, the D-FF circuits 24 and 25 do not become in a latch state during the period (=between t5 and t6) that the reset state is released, so that the H level applied to the D1 terminal is not latched. Therefore, the Q2 terminal of the D-FF circuit 25 is held in the output state at the L level. The switching state of the switching circuit 15 is held to the side of the comparison circuit 13. Therefore, even when noise is generated in the C terminal, etc., there is continued the control of the p-type MOSFET 2 as to on and off based on the error between the reference voltage Vref1 and the feedback voltage Va, and thus, the output voltage Vout of the target level is generated from the input voltage Vin.

In a present embodiment, when the period of from the rise of the voltage Vd to the fall thereof is shorter than the period T2 (predetermined period) of from the rise of the voltage Vd to a second rise of the voltage Vf, the Q2 terminal of the D-FF circuit 25 is held in the output state at the L level. To be described in detail, when the period of from the rise of the voltage Vd to the fall thereof is longer than T1 and shorter than T2, for example, the D-FF circuit 24 becomes in a latch state at the rise of the voltage Vf applied to the Cp1 terminal, lathes the H level applied to the D1 terminal at this time, to be output from the Q1 terminal. At the similar timing, the D-FF circuit 25 becomes in a latch state at the rise of the voltage Vf applied to the Cp2 terminal, latches the output voltage (L level) of the Q1 terminal applied to the D2 terminal at this time, to be output from the Q2 terminal. That is, when the period of from the rise of the voltage Vd to the fall thereof is less than T2, the Q2 terminal of the D-FF circuit 25 is held in the output state at the L level. In the case where the period of from the rise of the voltage Vd to the fall thereof is longer than T2, if the D-FF circuits are provided in number corresponding to the period, for example, even though noise is generated in the C terminal, etc., it becomes possible to continue the control of the p-type MOSFET 2 as to on and off based on the error between the reference voltage Vref1 and the feedback voltage Va.

Operation when Power Supply Line 50 is Short-Circuited

Subsequently, there will be given a description of an operation of the case where the power supply line 50 of the voltage generating circuit 1 using the switching control circuit 6 according to the present invention is short-circuited. The description will be made assuming that a period during which the error voltage Vb resulting from the short-circuit of the power supply line 50 is higher than the reference voltage Vref2 is longer than the period T (between t7 and t8) elapsing before the charged voltage of the capacitor 9 reaches the reference voltage Vref3, as shown in between t7 and t11 in FIG. 3.

The − input terminal of the error amplifier circuit 11 is applied, via the B terminal, with the feedback voltage Va according to the output voltage Vout in the case where the power supply line 50 is short-circuited. The above feedback voltage Va is lower (or higher) than the feedback voltage Va in the case where the power supply line 50 is not short-circuited. The error amplifier circuit 11 outputs the error voltage Vb obtained by amplifying the error between the reference voltage Vref1 applied to the + input terminal and the feedback voltage Va applied to the − input terminal. The comparison circuit 18 outputs the L level during the period of time that the error voltage Vb is higher than the reference voltage Vref2. Based on the above L level, the n-type MOSFET 20 is turned off, and thus, a current from the current source 21 is supplied to the capacitor 9. As a result, the capacitor 9 is charged. The charged voltage of the capacitor 9 is applied to the C terminal of the switching control circuit 6, and the voltage Vd of the C terminal is applied to the − input terminal of the comparison circuit 22. The short-circuit of the power supply line 50 allows the capacitor 9 to continue to be charged, and thus, when the charged voltage of the capacitor 9 reaches the reference voltage Vref3 (t8), the comparison circuit 22 outputs the voltage Ve of the L level during the period of time that the voltage Vd applied to the − input terminal is higher than the reference voltage Vref3. The reset state of the D-FF circuits 24 and 25 is released during the period of time that each of the R terminals is applied with the voltage Ve of the L level. The triangular-wave converting circuit 26 generates the square-wave voltage Vf, which falls at the maximum value of the voltage Vt and rises at the minimum value thereof, to be output to the Cp1 terminal and the Cp2 terminal of the D-FF circuits 24 and 25. The D-FF circuit 24 becomes in a latch state at the rise of the voltage Vf of the Cp1 terminal, latches the H level applied to the D1 terminal at this time, to be output from the Q1 terminal (t9). At the similar timing, the D-FF circuit 25 becomes in a latch state at the rise of the voltage Vf of the Cp2 terminal, latches the output voltage (L level) of the Q1 terminal applied to the D2 terminal at this time, to be output from the Q2 terminal. Subsequently, since each of the R terminals of the D-FF circuits 24 and 25 are applied with the voltage Ve of the L level, the reset state is continued to be released. Thus, the D-FF circuit 24 again becomes in a latch state at the rise of the voltage Vf of the Cp1 terminal, latches the H level applied to the D1 terminal at this time, to be output from the Q1 terminal (t10). At the similar timing, the D-FF circuit 25 again becomes in a latch state at the rise of the voltage Vf of the Cp2 terminal, latches the output voltage (H level) of the Q2 terminal applied to the D2 terminal at this time, to be output from the Q2 terminal. That is, the D-FF circuit 25 does not output the H level from the Q2 terminal until the voltage Vf applied to the Cp1 and Cp2 terminals of the D-FF circuits 24 and 25 rises twice after the charged voltage of the capacitor 9 has reached the reference voltage Vref3. The inverter 27 outputs the L level obtained by inverting the H level. The above L level is applied to the other input terminal of the NAND circuit 31B, and the NAND circuit 31B outputs the H level. Thus, both the one and the other input terminals of the NAND circuit 31A are applied with the H level, and thereby, the NAND circuit 31A outputs the L level. The latch circuit 28 continues to output the L level irrespective of the subsequent output voltage of the inverter 27. Then, based on the L level, the switching circuit 15 is switched to the side of the latch circuit 28, and thus, each gate electrode of the p-type MOSFET 16 and the n-type MOSFET 17 is applied with the L level. Thus, the p-type MOSFET 16 is turned on and the n-type MOSFET 17 is turned off. The H level of the drain electrode of the p-type MOSFET 16 is applied via the A terminal to the gate electrode of the p-type MOSFET 2. Therefore, the p-type MOSFET 2 is turned off, and on top of this, held in the off state. As a result, the current supply via the p-type MOSFET 2 to the inductor 4 and the capacitor 5 is blocked, thereby preventing damage of the p-type MOSFET 2, etc.

According to an embodiment described above, the p-type MOSFET 2 is turned off when the voltage Ve of the L level of the comparison circuit 22 continues at least from the rise of the voltage Vf to the subsequent rise thereof. That is, it is not that the p-type MOSFET 2 is turned off concurrently with a state that the charged voltage (voltage Vd) of the capacitor 9 becomes higher than the reference voltage Vref3, but that the p-type MOSFET 2 can be turned off when the above state is continued in a predetermined period (at least from the rise of the voltage Vf to the subsequent rise thereof). Therefore, it becomes possible to generate the output voltage Vout from the input voltage Vin irrespective of the generation of noise in the C terminal, etc.

It is possible to generate the voltage Vf using the output voltage Vt of the triangular wave generator 114 provided in the conventional switching control circuit 105. Therefore, it becomes possible to prevent increase in cost, complication of a circuit wiring, and so on, related to the switching control circuit 6 according to the present invention.

Another Embodiment

The above embodiments of the present invention are simply for facilitating the understanding of the present invention and are not in any way to be construed as limiting the present invention. The present invention may variously be changed or altered without departing from its spirit and encompass equivalents thereof.

Embodiment of Switching Control Circuit Using Delay Circuit, etc.

According to an embodiment described above, the switching control circuit 6 provided with the triangular-wave converting circuit 26, the D-FF circuits 24 and 25, and the inverter 27 is used in the voltage generating circuit 1 to prevent the p-type MOSFET 2 from being turned off when noise is generated in the C terminal, etc. However, this is not a limitative case. For example, a switching control circuit 60 provided with a delay circuit 61 and an OR circuit 62 (output circuit) shown in FIG. 4 may be used in the voltage generating circuit 1. Hereinafter, there will be given a description of the voltage generating circuit 1 using the switching control circuit 60 shown in FIG. 4. In a configuration shown in FIG. 4, components equivalent to those shown in FIG. 1 are designated by the same reference numeral to omit the description.

Figure 5:
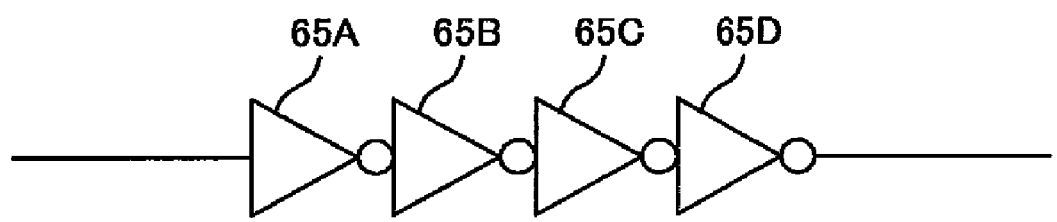
FIG. 5 is a diagram showing one example of a configuration of a delay circuit.

The delay circuit 61 is configured with four inverters 65A to 65D as shown in FIG. 5, for example. The inverters 65A to 65D are connected in series between the output terminal of the comparison circuit 22 and one input terminal of the OR circuit 62. The inverter 65A outputs the L level obtained by inverting the H level and outputs the H level obtained by inverting the L level. The inverter 65B outputs the H level obtained by inverting the L level and outputs the L level obtained by inverting the H level. The inverter 65C outputs the L level obtained by inverting the H level and outputs the H level obtained by inverting the L level. The inverter 65D outputs a voltage Vx of the H level obtained by inverting the L level and outputs a voltage Vx of the L level obtained by inverting the H level. That is, by performing the inverting operation described above, the inverters 65A to 65D delay a timing at which voltage is outputted from an output terminal of the inverter 65D with respect to a timing at which the voltage Ve is applied to the input terminal of the inverter 65A.

One input terminal of the OR circuit 62 is connected to the output terminal of the inverter 65D, the other input terminal thereof is connected to the output terminal of the comparison circuit 22, and an output terminal thereof is connected to the other input terminal of the NAND circuit 31B of the latch circuit 28. The OR circuit 62 outputs a voltage Vy of the H level when both the one and the other input terminals thereof are applied with the H level, and otherwise outputs a voltage Vy of the L level.

Figure 4:
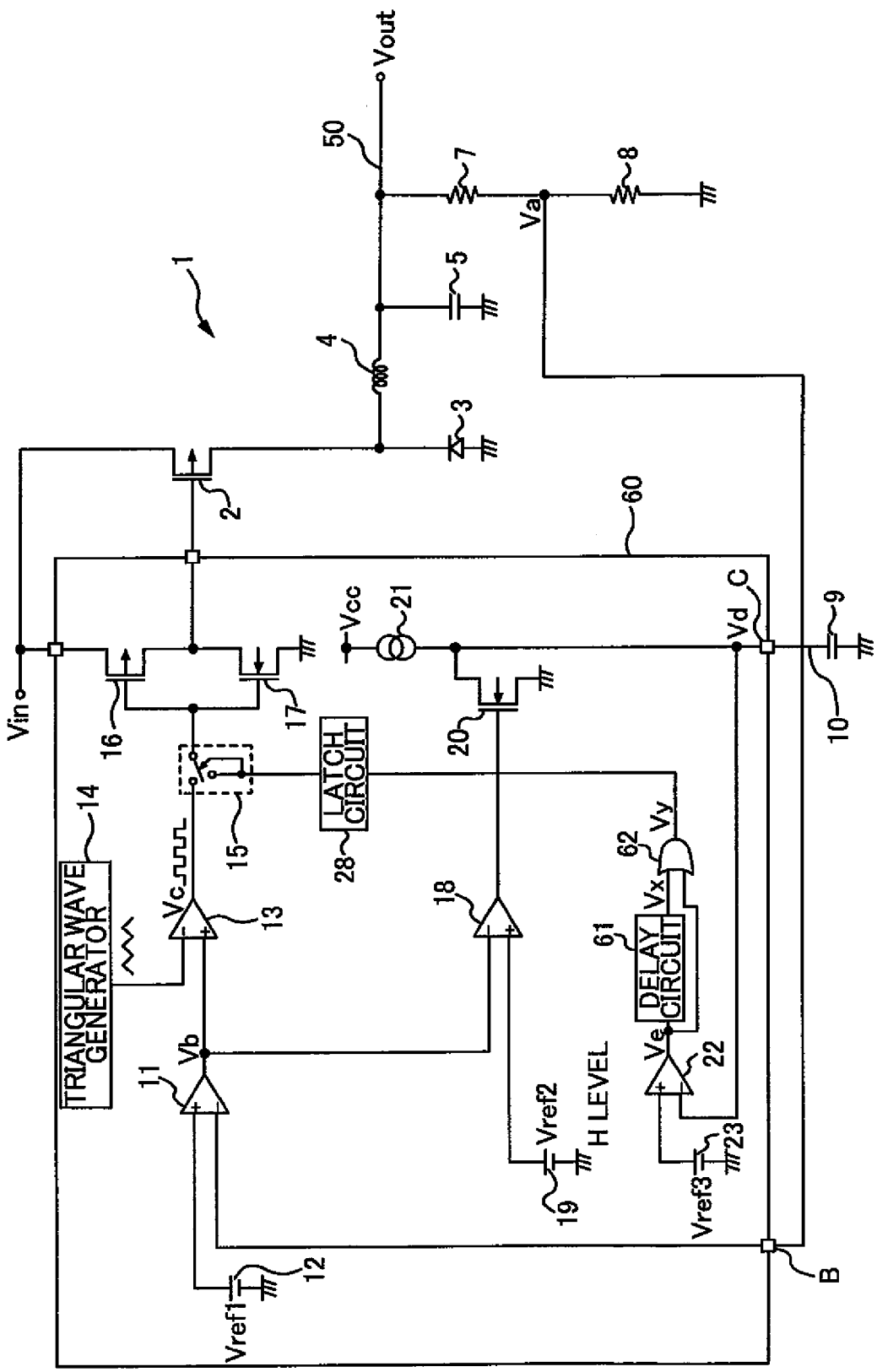
FIG. 4 is a diagram showing another embodiment of a switching control circuit according to one embodiment of the present invention.
Figure 6:
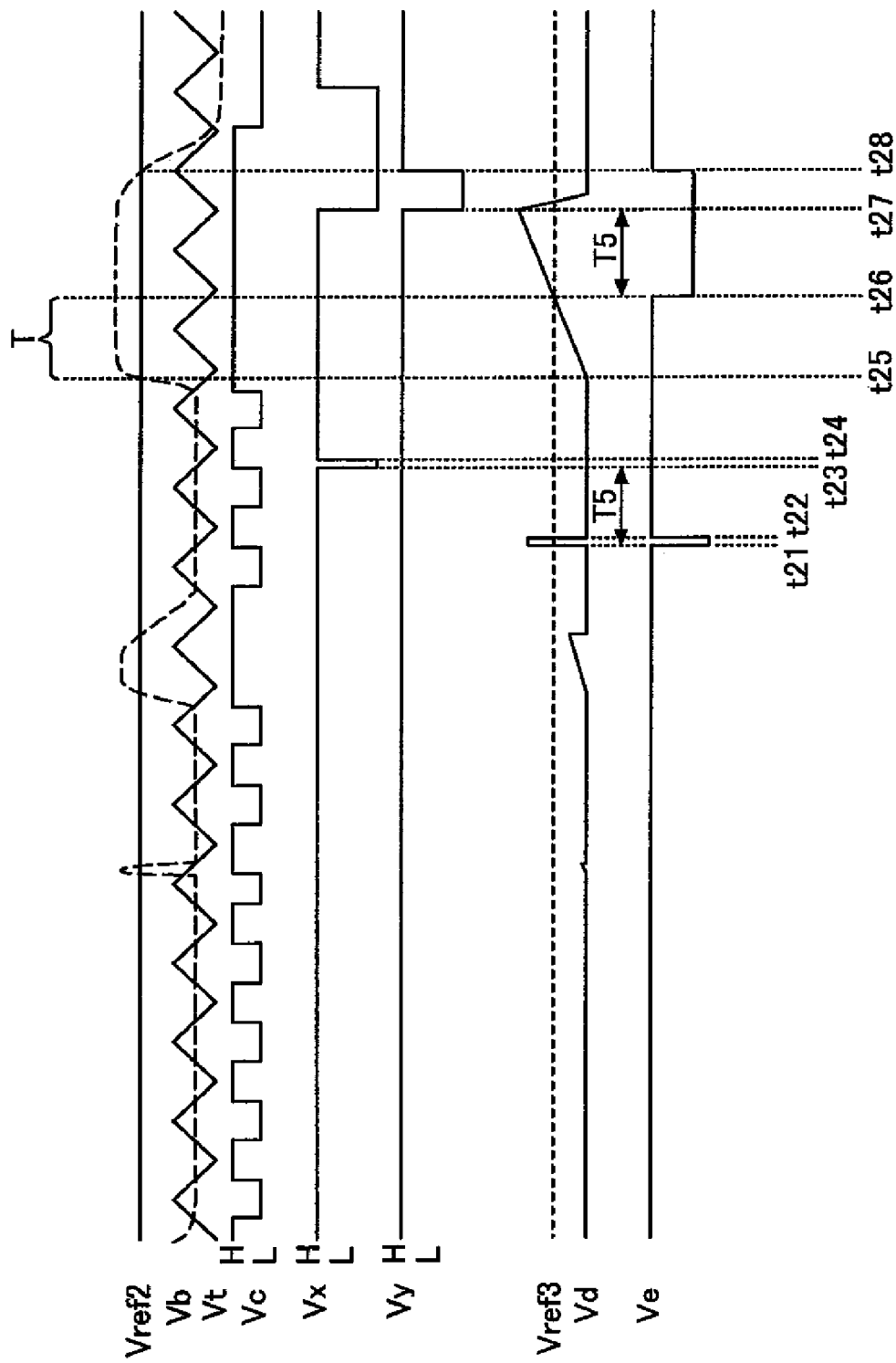
FIG. 6 is a timing chart showing an operation of a voltage generating circuit including the switching control circuit shown in FIG. 4 is applied.
Figure 7:
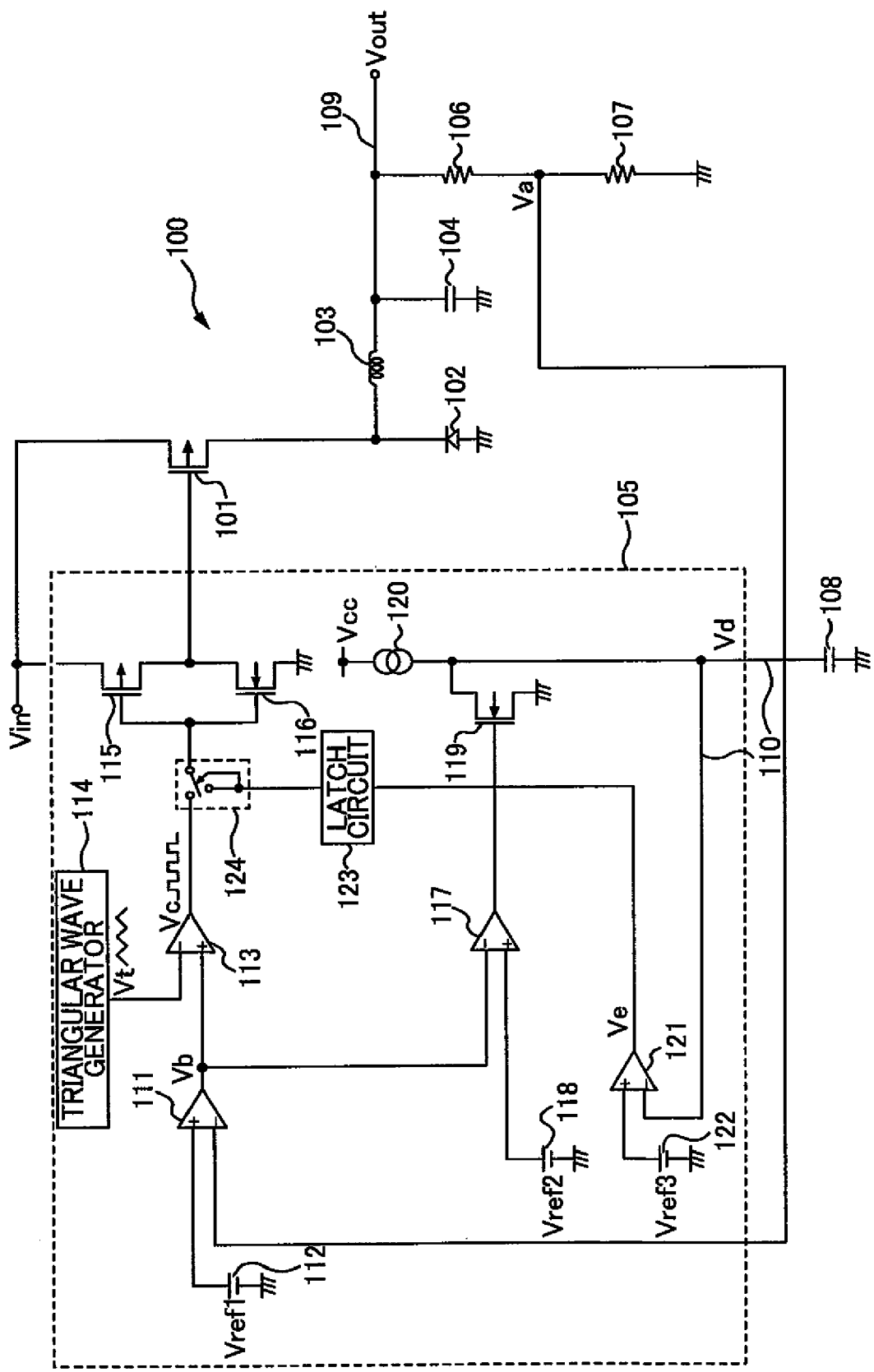
FIG. 7 is a diagram showing a configuration of a voltage generating circuit.
Figure 8:
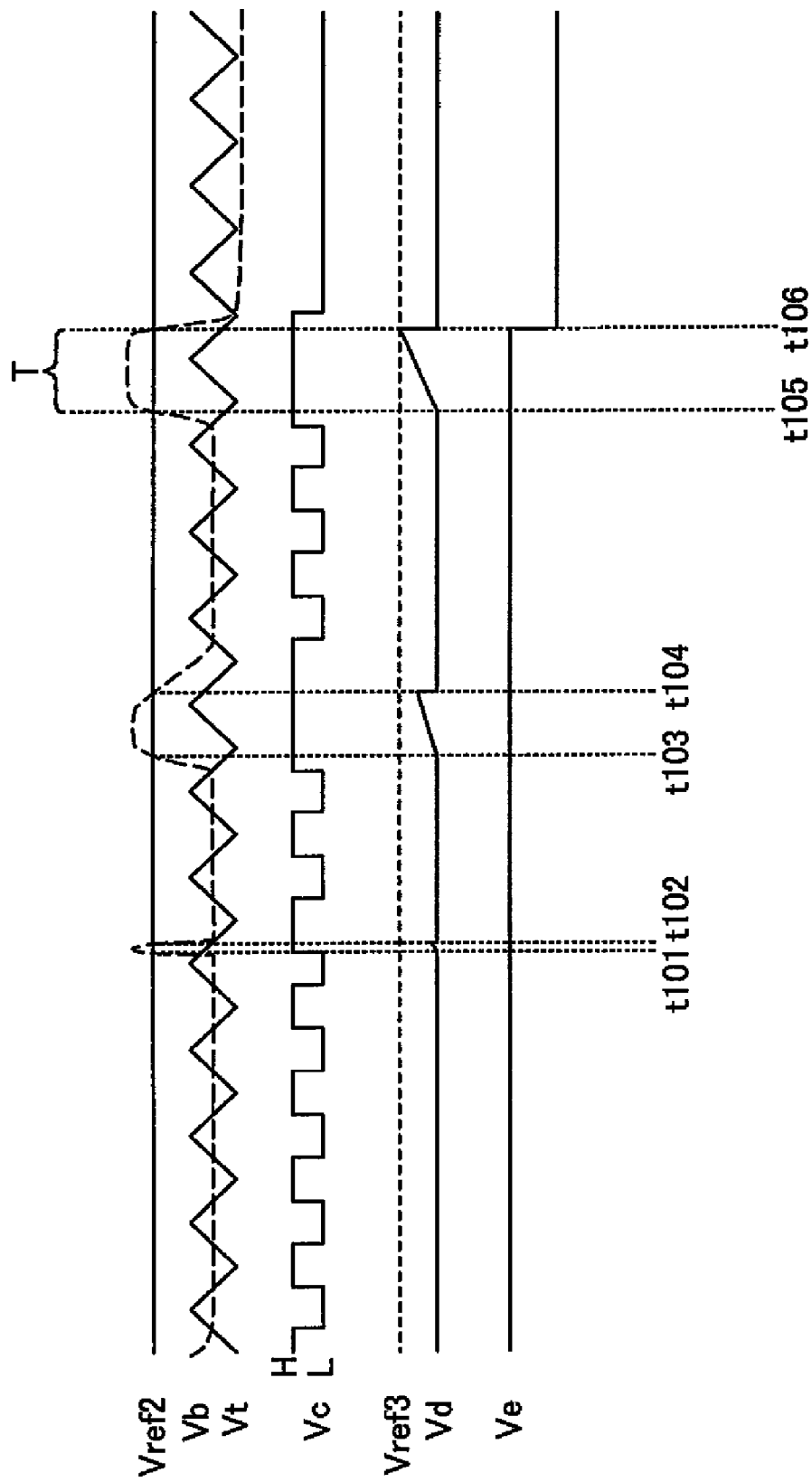
FIG. 8 is a timing chart showing an operation of a voltage generating circuit in FIG. 7.
Figure 9:
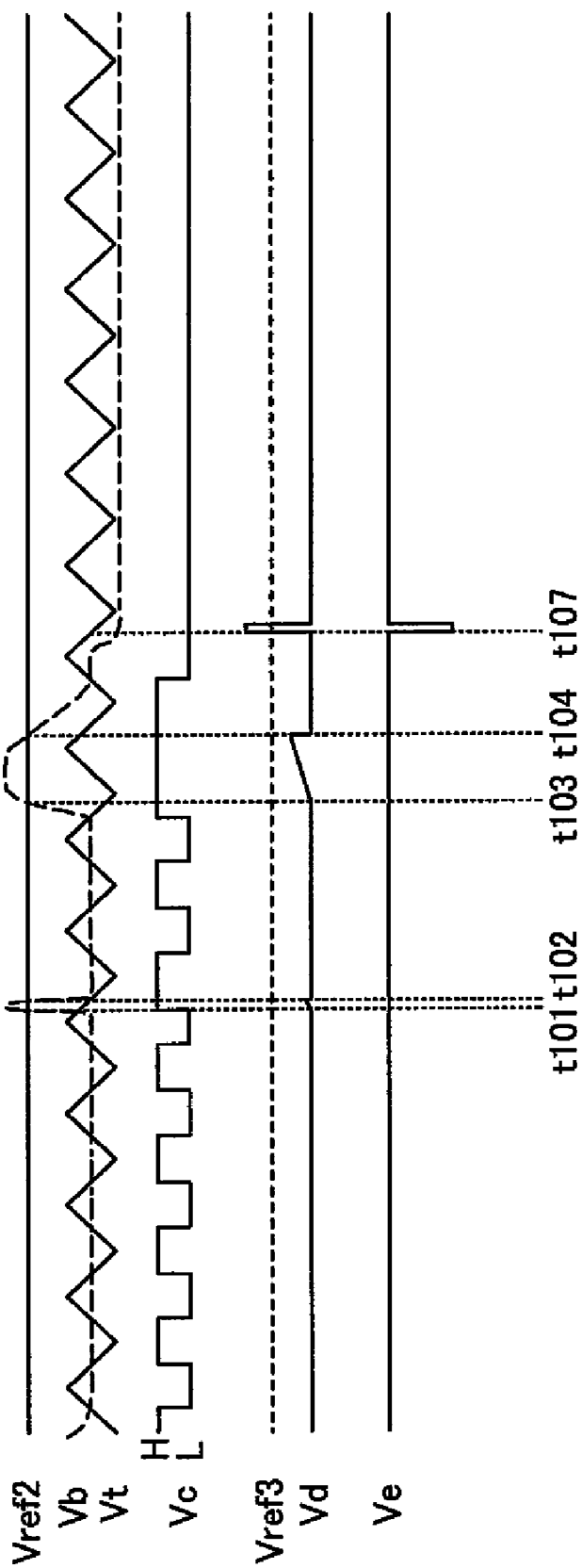
FIG. 9 is a timing chart showing an operation of a voltage generating circuit in FIG. 7.

Hereinafter, with reference to FIG. 6, there will be given a description of an operation of the voltage generating circuit 1 including the switching control circuit 60 shown in FIG. 4, when noise is generated in the C terminal, etc. The description will be made assuming that the voltage Vd of the C terminal becomes higher than the reference voltage Vref3 resulting from the noise generation in the C terminal, etc., as shown in between t21 and t22 in FIG. 6.

The comparison circuit 22 outputs the voltage Ve of the L level during the period of time that the voltage Vd applied to the − input terminal is higher than the reference voltage Vref3. Herein, in a present embodiment, a period (t21 to t22) of from the rise of the voltage Vd resulting from the noise generation in the C terminal, etc. to the fall thereof is shorter than a period T5 (t21 to t23) of from the time when the input terminal of the inverter 65A is applied with the voltage Ve of the L level to the time when the voltage Vx of the L level is outputted from the output terminal of the inverter 65D. That is, when noise is generated in the C terminal, etc., the delay circuit 61 provides a delay by the inverting operation of the inverters 65A to 65D so that each input terminal of the OR circuit 62 is not simultaneously inputted with the L level. As a result, the OR circuit 62 outputs the voltage Vy of the H level based on the voltage Vx of the H level from the delay circuit 61 between t21 and t22. The OR circuit 62 outputs the voltage Vy of the H level based on the voltage Ve of the H level from the comparison circuit 22 between t23 and t24. That is, the voltage Vx of the OR circuit 62 is held in the output state at the H level. Therefore, even when noise is generated in the C terminal, etc., the control of the p-type MOSFET 2 as to on and off based on the error between the reference voltage Vref1 and the feedback voltage Va is continued, and thereby, the output voltage Vout of the target level is generated from the input voltage Vin.

Subsequently, there will be given a description of an operation of the voltage generating circuit 1 using the switching control circuit 60 shown in FIG. 4, when the power supply line 50 is short-circuited. The description will be made assuming that a period during which the error voltage Vb resulting from the short-circuit of the power supply line 50 is higher than the reference voltage Vref2 is longer than a period T (between t25 and t26) elapsing before the charged voltage of the capacitor 9 reaches the reference voltage Vref3, as shown in between t25 and t28 in FIG. 6.

The − input terminal of the error amplifier circuit 11 is applied via the B terminal with the feedback voltage Va according to the output voltage Vout in the case where the power supply line 50 is short-circuited. The feedback voltage Va is lower (or higher) than the feedback voltage Va in the case where the power supply line 50 is not short-circuited. The error amplifier circuit 11 outputs the error voltage Vb obtained by amplifying the error between the reference voltage Vref1 applied to the + input terminal and the feedback voltage Va applied to the − input terminal. The comparison circuit 18 outputs the L level during the period of time that the error voltage Vb is higher than the reference voltage Vref2. Based on the above L level, the n-type MOSFET 20 is turned off, and thus, a current from the current source 21 is supplied to the capacitor 9. As a result, the capacitor 9 is charged. The charged voltage of the capacitor 9 is applied to the C terminal of the switching control circuit 6, and the voltage Vd of the C terminal is applied to the − input terminal of the comparison circuit 22. The short-circuit of the power supply line 50 allows the capacitor 9 to continue to be charged, and thus, when the charged voltage of the capacitor 9 reaches the reference voltage Vref3 (t26), the comparison circuit 22 outputs the voltage Ve of the L level during the period of time that the voltage Vd applied to the − input terminal is higher than the reference voltage Vref3. When the comparison circuit 22 continues to output the voltage Ve of the L level also at the time when a period of delay provided by the delay circuit 61, i.e. the period T5 of delay provided by the inverting operation of the inverters 65A to 65D, has elapsed, one input terminal of the OR circuit 62 is applied with the voltage Vx of the L level and the other input terminal thereof is applied with the voltage Ve of the L level (t27). Therefore, the OR circuit 62 outputs the voltage Vy of the L level. The voltage Vy of the above L level is applied to the other input terminal of the NAND circuit 31B, and the NAND circuit 31B outputs the H level. As a result, when both the one and the other input terminals of the NAND circuit 31A are applied with the H level, the NAND circuit 31A outputs the L level. The latch circuit 28 continues to output the L level irrespective of the subsequent output voltage Vy of the OR circuit 62. Then, based on the L level, the switching circuit 15 is switched to the side of the latch circuit 28, and each gate electrode of the p-type MOSFET 16 and the n-type MOSFET 17 is applied with the L level. Thus, the p-type MOSFET 16 is turned on and the n-type MOSFET 17 is turned off. The H level of the drain electrode of the p-type MOSFET 16 is applied via the A terminal to the gate electrode of the p-type MOSFET 2. Therefore, the p-type MOSFET 2 is turned off, and on top of this, held in the off state. As a result, the current supply via the p-type MOSFET 2 to the inductor 4 and the capacitor 5 is blocked, thereby preventing damage of the p-type MOSFET 2, etc.

In another embodiment described above, the delay circuit 61 is configured with the four inverters 65A to 65D, but is not limited thereto. It may be possible to use an appropriate even number of inverters according to a period of from the rise of the error voltage Vb, to the fall thereof in the case where noise is generated in the C terminal, etc.

In a present embodiment and another embodiment, the switching control circuit 6 (60) is used in the step-down voltage generating circuit 1, but is not limited thereto. The switching control circuit 6 (60) may be used for a step-up voltage generating circuit not shown.

According to another embodiment described above, when the output of the voltage Vx of the L level from the delay circuit 61 matches that of the voltage Ve of the L level from the comparison circuit 22, the p-type MOSFET 2 is turned off. That is, it is not that the p-type MOSFET 2 is turned off at the same time that the charged voltage (voltage Vd) of the capacitor 9 is higher than the reference voltage Vref3, but that the p-type MOSFET 2 can be turned off when the predetermined period (period T5 of delay provided by the delay circuit 61) has elapsed. Therefore, it is possible to generate the output voltage Vout from the input voltage Vin irrespective of the generation of noise in the C terminal, etc.

According to a present embodiment and another embodiment described above, it becomes possible to hold the L level in the latch circuit 28, thereby allowing the p-type MOSFET 2 to be held in the off state. Therefore, even when the output voltage of the inverter 27 or that of the OR circuit 62 changes, it becomes possible to prevent the p-type MOSFET 2 from being turned on despite a short-circuited state of the power supply line 50.

When the reference voltage Vref2 is rendered higher than the voltage Vt at the maximum value, it becomes also possible to prevent the n-type MOSFET 20 from being frequently turned on and off. Therefore, it becomes possible to prevent the capacitor 9 from being frequently charged and discharged in a repeated manner.

What is claimed is:

1. A switching control circuit of a voltage generating circuit generating an output voltage of a target level from an input voltage by turning on and off a transistor applied with the input voltage, the switching control circuit controlling the transistor as to on and off, comprising:

an error amplifier circuit configured to output an error voltage obtained by amplifying an error between a voltage according to the output voltage and a first reference voltage according to the target level;

a first comparison circuit configured to compare between the error voltage and a second reference voltage changing at a predetermined frequency to output a first control voltage for turning on and off the transistor;

a second comparison circuit configured to compare between the error voltage and a third reference voltage to: output a first voltage when the error voltage is higher than the third reference voltage; and output a second voltage when the error voltage is lower than the third reference voltage;

a charging and discharging circuit configured to charge a capacitor based on the first voltage and to discharge the capacitor based on the second voltage;

a third comparison circuit configured to compare between a charged voltage of the capacitor and a fourth reference voltage according to a capacitance of the capacitor; and a control circuit configured to output a second control voltage for turning off the transistor irrespective of the first control voltage, when a comparison result of the third comparison circuit in the case where the charged voltage of the capacitor is higher than the fourth reference voltage continues for a predetermined period.

2. The switching control circuit of claim 1, wherein the control circuit comprises:

a generating circuit configured to generate a binary signal from the second reference voltage; and an output circuit configured to output the second control voltage when the comparison result of the third comparison circuit continues for the predetermined period based on the binary signal.

3. The switching control circuit of claim 1, wherein the control circuit comprises:

a delay circuit configured to delay a comparison result of the third comparison circuit, by the predetermined period, to be output; and an output circuit configured to output the second control voltage according to an output of the delay circuit and a comparison result of the third comparison circuit.

4. The switching control circuit of claim 1, further comprising a hold circuit configured to hold the second control voltage, wherein the transistor is turned off based on the second control voltage held by the hold circuit.

5. The switching control circuit of claim 1, wherein the third reference voltage is higher than the second reference voltage at a maximum value.

* * * * *